(12) United States Patent
Sherwin et al.

(10) Patent No.: US 10,186,742 B2
(45) Date of Patent: Jan. 22, 2019

(54) PHASE-CHANGE MATERIAL RECONFIGURABLE CIRCUITS

(71) Applicants: Marc Eisenzweig Sherwin, Catonsville, MD (US); Robert S. Howell, Silver Spring, MD (US); Pavel Borodulin, Baltimore, MD (US); Harold Clifton Hearne, III, Baltimore, MD (US); Nabil Abdel-Meguid El-Hinnawy, Columbia, MD (US); Robert Miles Young, Ellicott City, MD (US)

(72) Inventors: Marc Eisenzweig Sherwin, Catonsville, MD (US); Robert S. Howell, Silver Spring, MD (US); Pavel Borodulin, Baltimore, MD (US); Harold Clifton Hearne, III, Baltimore, MD (US); Nabil Abdel-Meguid El-Hinnawy, Columbia, MD (US); Robert Miles Young, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 1289 days.

(21) Appl. No.: 13/803,385

(22) Filed: Mar. 14, 2013

(65) Prior Publication Data
US 2014/0266300 A1 Sep. 18, 2014

(51) Int. Cl.
*H01P 1/10* (2006.01)
*H01L 45/02* (2006.01)
(Continued)

(52) U.S. Cl.
CPC .............. *H01P 1/10* (2013.01); *H01L 45/06* (2013.01); *H03K 19/1736* (2013.01); *H03K 19/17736* (2013.01)

(58) Field of Classification Search
CPC .......... H01P 1/10; H01P 1/18; H01Q 15/002; H03K 17/693; H03K 19/173; H03K 19/1736; H03K 19/17736
(Continued)

(56) References Cited

U.S. PATENT DOCUMENTS

| | | | | |
|---|---|---|---|---|
| 6,828,884 B2 * | 12/2004 | Wyeth | ....................... | H01P 1/10 257/3 |
| 7,608,851 B2 * | 10/2009 | Chen | ................... | H01L 27/2436 257/2 |
| 7,880,194 B2 * | 2/2011 | Breitwisch et al. | .......... | 257/108 |

OTHER PUBLICATIONS

Wen, et al.: "*A Phase-Change Via-Reconfigurable On-Chip Inductor*", IEEE 2010, IEDM10-237 thru IEDM10-240.
(Continued)

*Primary Examiner* — Dean Takaoka
*Assistant Examiner* — Alan Wong
(74) *Attorney, Agent, or Firm* — Tarolli, Sundheim, Covell & Tummino LLP (57) ABSTRACT

One embodiment of the invention includes a reconfigurable circuit comprising a phase-change material switch. The phase-change material switch includes an actuation portion configured to receive a control signal having one of a first state and a second state and to emit a first heat profile in response to the first state of the control signal and a second heat profile in response to the second state of the control signal. The phase-change material switch also includes a switch portion comprising a phase-change material in proximity with the actuation portion. The switch portion can be selectable between a conducting state in response to the first heat profile to conduct an input signal from an input to an output of the phase-change material switch and a blocking state in response to the second heat profile to substantially block the input signal from the input to the output.

17 Claims, 4 Drawing Sheets

(51) Int. Cl.
*H03K 19/173* (2006.01)
*H01L 45/00* (2006.01)
*H03K 19/177* (2006.01)

(58) Field of Classification Search
USPC .......................... 333/101, 104, 262; 257/2, 3
See application file for complete search history.

(56) References Cited

OTHER PUBLICATIONS

Bolton: "*Mobile Device RF Front-End TAM Analysis and Forecast*", CS MANTECH Conference, May 16-19, 2011, Palm Springs, CA, USA, pp. 1-4.

\* cited by examiner

PHASE-CHANGE MATERIAL RECONFIGURABLE CIRCUITS

TECHNICAL FIELD

This disclosure relates generally to electronic systems, and specifically to phase-change material reconfigurable circuits.

BACKGROUND

Switching devices are implemented for a variety of reasons and in a variety of applications. For example, switching devices can be implemented for logic circuit and computing applications, for radio-frequency (RF) signal switching in front-end receiver systems, for RF transmitter systems, or a variety of other applications. Transistor technology has advanced considerably with respect to reduction of size and increase in efficiency. However, transistor switching circuits can still exhibit signal losses from switching and interconnects, can still occupy a sizeable space on a printed circuit board (PCB), and can still consume significant power in maintaining activation of the switches for a given switching configuration. Other switching devices can implement micro-electromechanical systems (MEMS) switches. However, MEMS processing can be expensive and difficult, can require specialized packaging constraints, and can still exhibit switching losses and activation power consumption.

SUMMARY

One embodiment of the invention includes a reconfigurable circuit comprising a phase-change material switch. The phase-change material switch includes an actuation portion configured to receive a control signal having one of a first state and a second state and to emit a first heat profile in response to the first state of the control signal and a second heat profile in response to the second state of the control signal. The phase-change material switch also includes a switch portion comprising a phase-change material in proximity with the actuation portion. The switch portion can be selectable between a conducting state in response to the first heat profile to conduct an input signal from an input to an output of the phase-change material switch and a blocking state in response to the second heat profile to substantially block the input signal from the input to the output.

Another embodiment of the invention includes a reconfigurable circuit. The circuit includes a switch configuration comprising a plurality of phase-change material switches that each comprise a phase-change material configured to switch between a conducting state corresponding to a substantially short circuit and a blocking state corresponding to a substantially open circuit in response to one of a respective plurality of control signals. The plurality of phase-change switches can be configured to route each of at least one input signal from one of at least one input of the reconfigurable circuit to one of at least one output of the reconfigurable circuit. The circuit also includes a switch controller configured to generate the plurality of control signals that are each provided in one of the first state and the second state to switch the respective one of the plurality of phase-change material switches between the conducting state and the blocking state.

Another embodiment of the invention includes a method for controlling a reconfigurable circuit. The method includes generating a plurality of control signals as pulsed signals having first pulse characteristics corresponding to a conductive state and second pulse characteristics corresponding to a blocking state. The method also includes providing the plurality of control signals to an actuation portion of each of a plurality of phase-change material switches, the actuation portion being proximal to a respective switch portion of each of the plurality of phase-change material switches and being configured to generate a first heat profile in response to the first pulse characteristics to set the switch portion to the conductive state and a second heat profile in response to the second pulse characteristics to set the switch portion to the blocking state. The method further includes routing each of at least one input signal from one of at least one input of the reconfigurable circuit to one of at least one output of the reconfigurable circuit based on a state of each of the plurality of phase-change material switches.

DETAILED DESCRIPTION

This disclosure relates generally to electronic systems, and specifically to phase-change material reconfigurable circuits. A reconfigurable circuit can include one or more phase-change material switches. The phase-change material switches can include an actuation portion and a switch portion that are proximal to each other. The actuation portion can be configured to receive control signal pulses that can generate a heat profile from the actuation portion to the switch portion based on a state of the control signal. For example, the control signal can be provided in a first state (e.g., having a low power, longer pulse) to provide a first heat profile from the actuation portion, and can be provided in a second state (e.g., having a high power, shorter pulse) to provide a second heat profile from the actuation portion. The heat profile provided from the actuation portion can set a phase-change material in the switch portion to one of a conducting state and a blocking state, such as based on crystallizing the phase-change material to crystalline state or melting the phase-change material to an amorphous state, respectively. Therefore, an input signal that is provided to the switch portion can either be conducted or substantially blocked based on the state of the switch portion.

The reconfigurable circuit can include a plurality of phase-change material switches arranged as a switch configuration and a switch controller configured to generate a respective plurality of control signals. As a result, the reconfigurable circuit can be configured to route at least one input signal between a plurality of signal paths to at least one output of the reconfigurable circuit based on the respective states of the phase-change material switches. The phase-change material switches can be fabricated to be substantially inline (i.e., collinear) with transmission lines that can form respective inputs and outputs for the phase-change material switches, such that the at least one input signal can be routed in three-dimensions through the switch configuration. Based on the fabrication of the phase-change material switches as substantially in-line with the transmission lines, and based on the structure of the switch configuration in three-dimensions, the switch configuration can occupy a significantly smaller volume on a circuit board than conventional switch configurations. Furthermore, because the phase-change material of the switch portion changes state in response to a pulsed signal, the phase-change material exhibits hysteresis with respect to the state of the switch. Accordingly, the reconfigurable circuit can exhibit significant power savings relative to conventional switch configurations based on not having to maintain power to the switches to maintain a given state of the respective switch.

Figure 1:
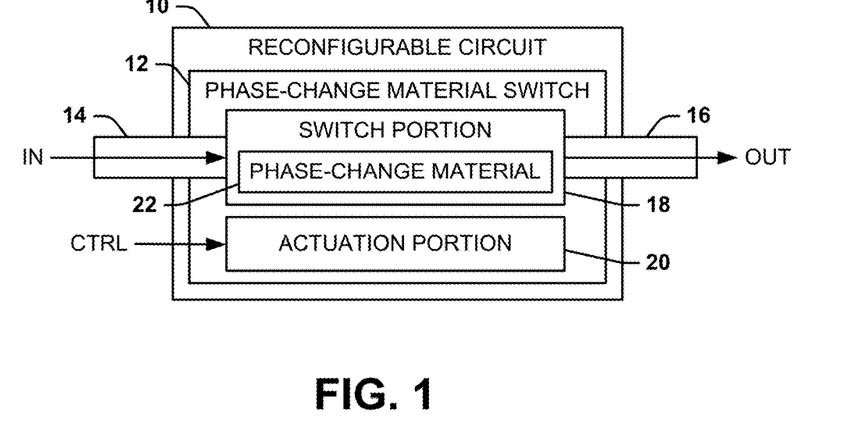
FIG. 1 illustrates an example of a reconfigurable circuit.

FIG. 1 illustrates an example of an example of a reconfigurable circuit 10. The reconfigurable circuit 10 includes a phase-change material switch 12. The reconfigurable circuit 10 can be implemented in any of a variety of applications that require one or more switches that can be opened or closed to pass or block a signal. For example, the reconfigurable circuit 10 can be implemented in logic circuit and computing applications, radio-frequency (RF) signal switching in front-end receiver systems or transmitter systems, such as an RF field-programmable gate array (FPGA). As an example, the reconfigurable circuit 10 can be fabricated, at least in part, based on the fabrication techniques described in Ser. No. 13/828,351, titled Phase-Change Material Switch and Method of Making the Same, which is incorporated herein by reference in its entirety.

In the example of FIG. 1, the phase-change material switch 12 includes an input 14 that receives an input signal IN, and includes an output 16 that can provide the input signal IN as an output signal OUT in a conducting state of the phase-change material switch 12, such that the phase-change material switch 12 acts substantially as a short-circuit, or can block the input signal IN from being provided as the output signal OUT in a blocking state of the phase-change material switch 12, such that the phase-change material switch 12 acts substantially as an open-circuit. As an example, the input signal IN can be provided as a radio frequency (RF) signal.

The phase-change material switch 12 includes a switch portion 18 and an actuation portion 20. The switch portion 18 includes a phase-change material 22 that can allow the switch portion 18, and thus the phase-change material switch 12, to be set to the conducting state or the blocking state. As described herein, a phase-change material (e.g., the phase-change material 22) is any material that exhibits variable electrical resistivity that is dependent on crystallinity. As an example, the phase-change material 22 can be a chalcogenide material, such as germanium telluride (GeTe), germanium antimony telluride (GeSbTe), germanium selenium telluride (GeSeTe), or any of a variety of similar materials. The phase change material 22 can thus be set to a crystalline state to set the switch portion 18, and thus the phase-change material switch 12, to the conducting state, or can be set to an amorphous state to set the switch portion 18, and thus the phase-change material switch 12, to the blocking state.

The actuation portion 20 can be configured to receive a control signal CTRL to switch the phase-change material 22 between the crystalline state and the amorphous state. The actuation portion 20 can include, for example, a metal or metal alloy material that exhibits resistivity and a substantially high thermal conductivity. For example, the actuation portion 20 can be formed from niobium (Nb), tungsten (W), platinum (Pt), nickel chromium (NiCr), titanium tungsten (TiW), or any of a variety of similar metal or metal alloys. The actuation portion 20 can be arranged substantially proximal to the phase-change material 22 in the switch portion 18, such that heat that is generated in the actuation portion 20 can be thermally conducted to the phase-change material 22 in the switch portion 18. As an example, the actuation portion 20 can be fabricated above the switch portion 18, below the switch portion 18, and/or laterally with respect to the switch portion 18. As another example, the actuation portion 20 could also include a plurality of portions of the metal or metal alloy material that can be distinct or integral with each other and are arranged adjacent to and/or surrounding the switch portion 18 and that are provided the control signal CTRL substantially concurrently. As yet another example, the actuation portion 20 and the switch portion 18 can be separated by a dielectric material (not shown) to substantially prevent electrical connectivity between the actuation portion 20 and the switch portion 18. In addition, the type of dielectric material and the thickness therein can be selected to allow the thermal conductivity from the actuation portion 20 to the switch portion 18, and to allow heat dissipation from the switch portion 18 to an associated substrate (not shown), as described in greater detail herein.

The control signal CTRL can be provided as, for example, a current pulse in one of two states to generate a heat profile in the actuation portion 20 via ohmic (i.e., $I^2R$) heat. As another example, the control signal CTRL can be another type of pulsed signal, such as an optical pulse having sufficient optical energy to heat the actuation portion 20 and/or the switch portion 18 directly. Thus, based on the proximal arrangement of the actuation portion 20 with respect to the switch portion 18, the heat profile can be thermally transferred to the phase-change material 22 in the switch portion 18 to control the state of the switch portion 18. As an example, the control signal CTRL can have pulse characteristics (e.g., amplitude and duration) that can dictate the heat profile. For example, the control signal CTRL can be provided in a first state (e.g., with first pulse characteristics) that can generate a first heat profile in the actuation portion 20, and can be provided in a second state (e.g., with second pulse characteristics) that can generate a second heat profile in the actuation portion 20. The first heat profile can correspond to setting the phase change material 22 to the crystalline state, and thus setting the switch portion 18 to the conducting state, and the second heat profile can correspond to setting the phase change material 22 to the amorphous state, and thus setting the switch portion 18 to the blocking state.

Figure 2:
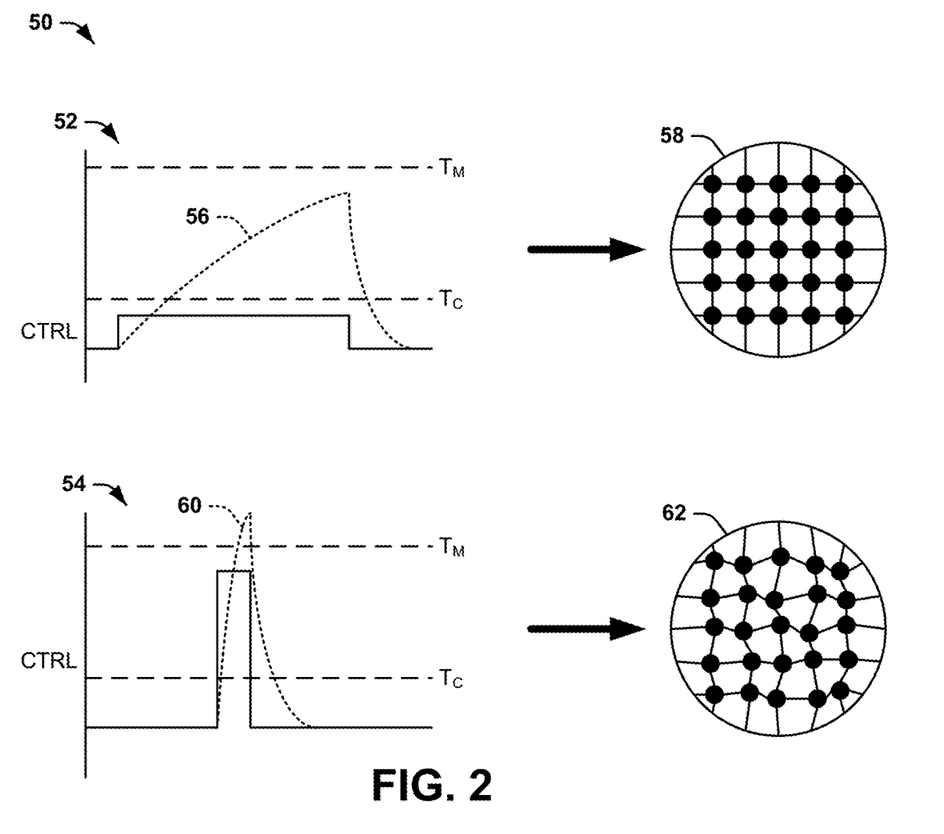
FIG. 2 illustrates an example diagram of states of a phase-change material.

FIG. 2 illustrates an example diagram 50 of states of a phase-change material. The phase-change material in the example of FIG. 2 can correspond to the phase-change material 22 in the example of FIG. 1, and can thus be part of a switch portion of a phase-change material switch, such as the phase-change material switch 12. Therefore, reference is to be made to the example of FIG. 1 in the following description of the example of FIG. 2.

The diagram 50 includes a first state diagram 52 that demonstrates the control signal CTRL in a first state and a second state diagram 54 that demonstrates the control signal CTRL in a second state. In each of the first and second states, the control signal CTRL is demonstrated as a pulsed signal (e.g., current pulse) having separate pulse characteristics (e.g., amplitude and duration) relative to each other. In the example of FIG. 2, the first state of the control signal CTRL is demonstrated in the first state diagram 52 as having pulse characteristics of a substantially lower amplitude and a substantially longer pulse width relative to the control signal CTRL in the second state diagram 54, which has a substantially high amplitude and a substantially shorter pulse width. The pulse characteristics of the control signal CTRL in each of the first state diagram 52 and the second state diagram 54 can be selected to provide a desired heat profile sufficient to achieve one of crystallization and melting of the phase-change material 22 to a respective one of a crystalline state and an amorphous state, as described herein, while maintaining sufficiently rapid switching characteristics of the switch portion 18.

In response to the application of the control signal CTRL to the actuation portion 20 in the first state, as demonstrated in the first state diagram 52, the actuation portion 20 generates a first heat profile 56 that corresponds to a temperature that is conducted to the phase-change material 22 in the switch portion 18 relative to a crystallization temperature $T_C$ and a melting temperature $T_M$. Thus, the first heat profile 56 provides that the temperature conducted to the phase-change material 22 as being greater in amplitude than the crystallization temperature $T_C$, but less than the melting temperature $T_M$, and which remains greater than the crystallization temperature $T_C$ for a time sufficient to crystallize the phase-change material 22, such as similar to an annealing process. In the example of FIG. 2, the crystallization of the phase-change material 22 is demonstrated at 58, which demonstrates the molecules of the phase-change material 22 arranged in a substantially crystalline (i.e., crystal lattice) structure. Therefore, the phase-change material 22 can be substantially conductive of electrical signals, such as the input signal IN in the example of FIG. 1. For example, the phase-change material 22 can have a conductivity that is approximately four orders of magnitude (i.e., $10^4$) greater in the crystalline state than in the amorphous state. Accordingly, in response to application of the control signal CTRL in the first state to the actuation portion 20 of the phase-change material switch 12, as demonstrated in the first state diagram 52, the switch portion 18 can be set to the conducting state.

In response to the application of the control signal CTRL to the actuation portion 20 in the second state, as demonstrated in the second state diagram 54, the actuation portion 20 generates a second heat profile 60 that corresponds to a temperature that is conducted to the phase-change material 22 in the switch portion 18 relative to the crystallization temperature $T_C$ and the melting temperature $T_M$. Thus, the second heat profile 60 provides that the temperature conducted to the phase-change material 22 as being greater in amplitude than the melting temperature $T_M$, and which decays substantially rapidly after the falling-edge of the pulse of the control signal CTRL, such as based on characteristics of the dielectric material that separates the switch portion 18 and the actuation portion 20 in the phase-change material switch 12. As a result of being heated above the melting temperature $T_M$, followed by rapid temperature decay to below the crystallization temperature $T_C$, the phase-change material 22 melts and solidifies into the amorphous state. The rapid temperature decay to below the crystallization temperature $T_C$ does not allow enough time for the molecules of the phase-change material 22 of the switch portion 18 to arrange into the crystalline state 58, such as based on selection of a sufficient dielectric material to thermally conduct heat from the phase-change material 22. In the example of FIG. 2, the amorphous state of the phase-change material 22 is demonstrated at 62, which shows the molecules of the phase-change material 22 arranged in an amorphous structure. Therefore, the phase-change material 22 can be substantially blocking of electrical signals, such as the input signal IN in the example of FIG. 1. Accordingly, in response to application of the control signal CTRL in the second state to the actuation portion 20 of the phase-change material switch 12, as demonstrated in the second state diagram 54, the switch portion 18 can be set to the blocking state. It is to be understood that the characteristics of the dielectric material, such as with respect to the type of the dielectric material and the thickness therein, can be selected to ensure a substantially rapid dissipation of the heat of the phase-change material 22 to substantially mitigate the recrystallization of the phase-change material 22 subsequent to melting, as described herein.

As demonstrated in the example of FIG. 2, the control signal CTRL is provided as a pulsed signal that implements a single pulse to switch the switch portion 18 of the phase-change material switch 12 between the conducting state and the blocking state. Subsequent to the application of the control signal CTRL to the actuation portion 20, the phase-change material 22 remains in the one of the crystalline state and the amorphous state, such that the switch portion 18 remains in the respective one of the conducting portion and the blocking portion after application of the control signal CTRL. As a result, the phase-change material switch 12 can maintain both the conducting state and the blocking state without application of any signal, and can thus operate with significantly less power than typical switches (e.g., transistor and micro-electromechanical systems (MEMS) switches). The phase-change material switch 12 can also exhibit sufficiently low losses with respect to the input signal IN (e.g., 0.5 dB or less). Furthermore, the switch portion 18 can exhibit significant isolation of the input signal IN (e.g., approximately 50 dB). Furthermore, as described in greater detail herein, the phase-change material switch 12 can be fabricated in a compact manner, such that the reconfigurable circuit 10 that can include a switch configuration of a plurality of the phase-change material switches 12 can occupy a substantially smaller circuit area relative to other conventional switch configurations.

Figure 3:
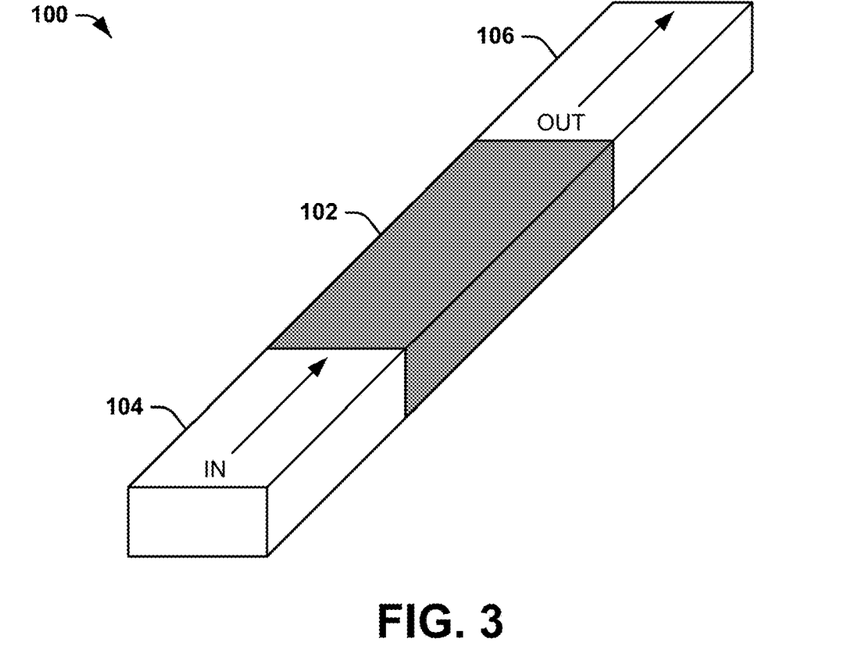
FIG. 3 illustrates an example of an inline phase-change material switch.

FIG. 3 illustrates an example of an inline phase-change material switch 100. The inline phase-change material switch 100 includes a switch portion 102 that can be fabricated of a phase-change material, such as the phase-change material 22 in the example of FIG. 1. The switch 100 also includes an input 104 that receives an input signal IN, and includes an output 106 that can provide the input signal IN as an output signal OUT in a conducting state of the switch portion 102, such that the switch portion 102 acts substantially as a short-circuit, or can block the input signal IN from being provided as the output signal OUT in a blocking state of the switch portion 102, such that the switch portion 102 acts substantially as an open-circuit. It is to be understood and appreciated that the inline phase-change material switch 100 can also include an actuation portion, such as the actuation portion 20 in the example of FIG. 1, that is not demonstrated in the example of FIG. 3.

As an example, the input signal IN can be provided as an RF signal that propagates on a transmission line. The input 104 and the output 106 can be part of the transmission line, such that the inline phase-change material switch 100 is fabricated such that the switch portion 102 is substantially in-line with the transmission line. As an example, the transmission line can be fabricated with a gap, such that the gap is filled with the phase-change material that constitutes the switch portion 102. As a result, the inline phase-change material switch 100 does not include separate contacts, unlike conventional transistor and/or MEMS switches, that can occupy additional space and can introduce signal losses from a lack of impedance matching. Furthermore, other types of compact switching arrangements can be implemented using the inline phase-change material switch 100. For example, the fabrication of the switch portion 12 in-line with the transmission line allows for fabrication of switch arrangements to provide for routing of signals in three-dimensions in a compact arrangement.

Figure 4:
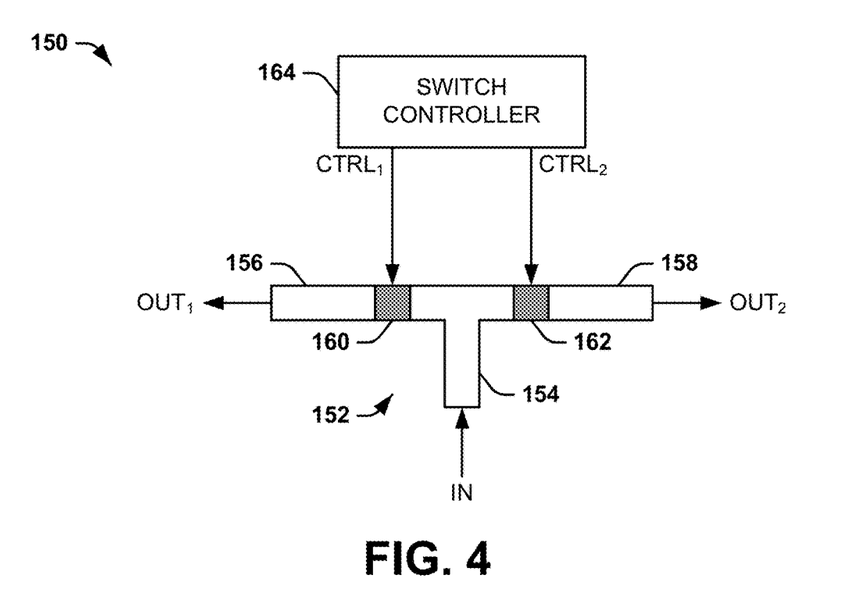
FIG. 4 illustrates an example of a reconfigurable circuit.

FIG. 4 illustrates an example of a reconfigurable circuit 150. The reconfigurable circuit 150 can be implemented to provide directional switching of the input signal IN between a plurality of outputs. The reconfigurable circuit 150 includes a transmission line system 152 that includes an input 154, a first output 156, and a second output 158. The first output 156 is separated from the input 154 via a first phase-change material switch 160, and the second output 158 is separated from the input 154 via a second phase-change material switch 162. The transmission line system 152 can correspond to a transmission line that is configured to propagate the input signal IN (e.g., an RF signal), and the input 154, the first output 156, such that respective switch portions of the first and second phase-change material switches 160 and 162 can be fabricated substantially in-line with the transmission line of the transmission line system 152.

The reconfigurable circuit 150 also includes a switch controller 164 that is configured to generate a first control signal $CTRL_1$ and a second control signal $CTRL_2$. The first and second control signals $CTRL_1$ and $CTRL_2$ can each be configured substantially similar to the control signal CTRL in the examples of FIGS. 1 and 2, such that the first and second control signals $CTRL_1$ and $CTRL_2$ can each be generated as pulsed signals (e.g., current pulses) that are provided in one of two states, such as demonstrated in the first and second state diagrams 52 and 54. Thus, the first and second control signals $CTRL_1$ and $CTRL_2$ can be provided to an actuation portion of the first and second phase-change material switches 160 and 162 to change the state of the phase-change material of the switch portion of the first and second phase-change material switches 160 and 162 between the crystalline state and the amorphous state. As a result, the reconfigurable circuit 150 can be configured to direct the input signal IN to one of the outputs 156 and 158 to be provided as one of a first output signal $OUT_1$ and a second output signal $OUT_2$. The reconfigurable circuit 150 can thus be implemented as a switching system in an active circuit to route the input signal IN to separate devices in a computing system or an RF front-end system.

Figure 5:
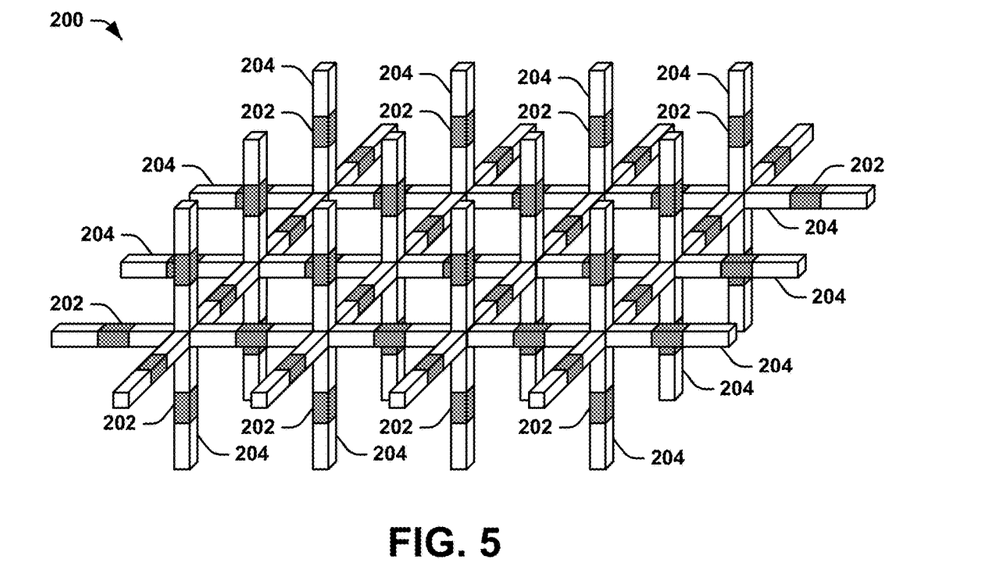
FIG. 5 illustrates an example of a phase-change material switch configuration.

As an example, a given reconfigurable circuit that implements a plurality of phase-change material switches can be fabricated as a switch configuration to provide a plurality of reconfigurable signal paths. FIG. 5 illustrates an example of a phase-change material switch configuration 200. The phase-change material switch configuration 200 includes a plurality of phase-change material switches 202 that are arranged substantially in-line with a plurality of transmission lines 204 (e.g., with respect to a switch portion of the respective phase-change material switches 202, as described herein). The phase-change material switches 202 can be arranged, for example, as a switch array. The phase-change material switch configuration 200 can be implemented to switch at least one input signal from at least one input to a given one of at least one output. Each of the plurality of phase-change material switches 202 can be individually controllable via respective control signals, such as substantially similar to the control signals CTRL in the examples of FIGS. 1 and 2. As a result, at least one input signal can be selectively routed through the transmission lines 204 in any of a variety of manners to be provided at any of the one or more outputs.

As demonstrated in the example of FIG. 5, the transmission lines 204 and the inline phase-change material switches 202 can be fabricated in an array of three-dimensions to route the input signal in any of the three dimensions through the phase-change material switch configuration 200. For example, the transmission lines 204 and the phase-change material switches 202 can be embedded within a substrate and/or other circuit components. As a result, the phase-change material switch configuration 200 can be fabricated in a significantly more compact manner than typical switch configurations that include transistor or MEMS switches. It is to be understood that, in the example of FIG. 5, not all of the phase-change material switches 202 and transmission lines 204 are numbered for purposes of ease of demonstration.

Figure 6:
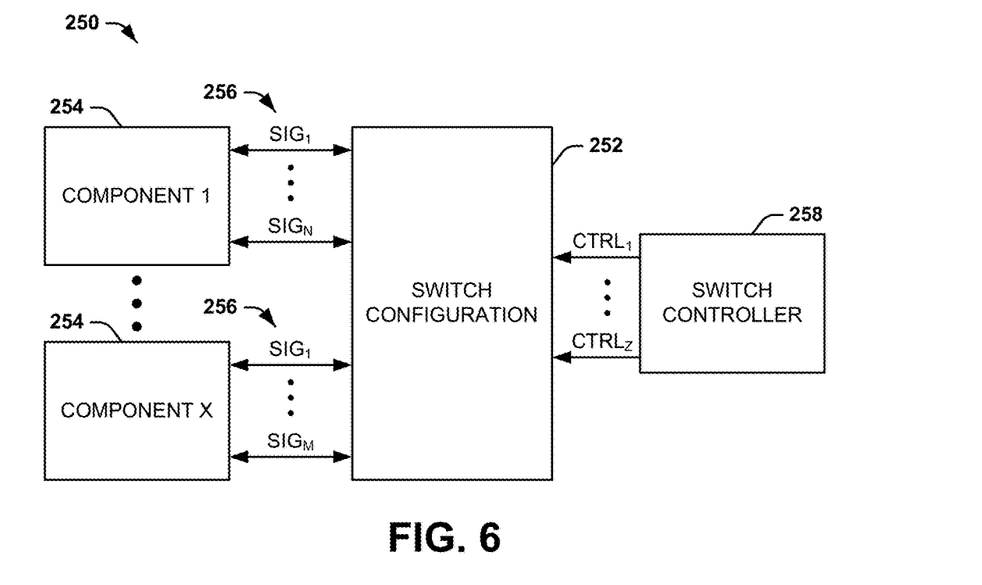
FIG. 6 illustrates an example of a reconfigurable circuit system.

FIG. 6 illustrates an example of a reconfigurable circuit system 250. The reconfigurable circuit system 250 can be implemented in a variety of applications, such as in a communication device (e.g., in an RF front-end), a sensor system (e.g., a radar system), or in a computer system. The reconfigurable circuit system 250 includes a switch configuration 252, which can be configured substantially similar to the phase-change material switch configuration 200 in the example of FIG. 5. The reconfigurable circuit system 250 also includes a plurality X of components 254, where X is a positive integer. The components 254 can be any of a variety of different types of components, such as separate circuit devices, filters, processors, memory devices, or any of a variety of other types of components. For example, the reconfigurable circuit system 250 can be implemented in an RF front-end, such that the components 254 can each be configured as notch filters that correspond to separate respective frequency bands.

Each of the components 254 is coupled to the switch configuration 252 via a plurality of signal lines 256 that are configured to propagate respective signals SIG, demonstrated as SIG1 though SIGN for a first component 254 and as SIG1 through SIGM for an $X^{th}$ component 254, where N and M are positive integers. The quantity of signals SIG can be different or the same for each of the components 254, such that N and M can have distinct values relative to each other and to quantities of other respective components 254. The signal lines 256 are demonstrated as bi-directional, such that some of the signal lines 256 can correspond to inputs, to outputs, or both with respect to the signals SIG that are provided to and/or from the respective component 254.

The reconfigurable circuit system 250 also includes a switch controller 258 that is configured to generate a plurality of control signals $CTRL_1$ through $CTRL_Z$, where Z is a positive integer. The control signals $CTRL_1$ and $CTRL_Z$ can each be provided to a respective phase-change material switch in the switch configuration 252 to control the states of the respective phase-change material switches between the conducting state and the blocking state. The control signals $CTRL_1$ through $CTRL_Z$ can be provided as pulsed signals, such as described herein, such that the switch configuration 252 can be reconfigurable in response to the pulsed control signals $CTRL_1$ through $CTRL_Z$. Thus, the phase-change material switches therein can remain in the respective states absent any additional provided power until reconfigured by additional application of the pulsed control signals $CTRL_1$ through $CTRL_Z$. Thus, based on the control of the state of the phase-change material switches in the switch configuration 252 via the control signals $CTRL_1$ through $CTRL_Z$, any of the signals SIG can be selectively routed from a given one or more of the components 254 to another given one or more of the components 254. Accordingly, the reconfigurable circuit system 250 can be implemented in any application that may require selective switching of one or more signals between separate devices.

Figure 7:
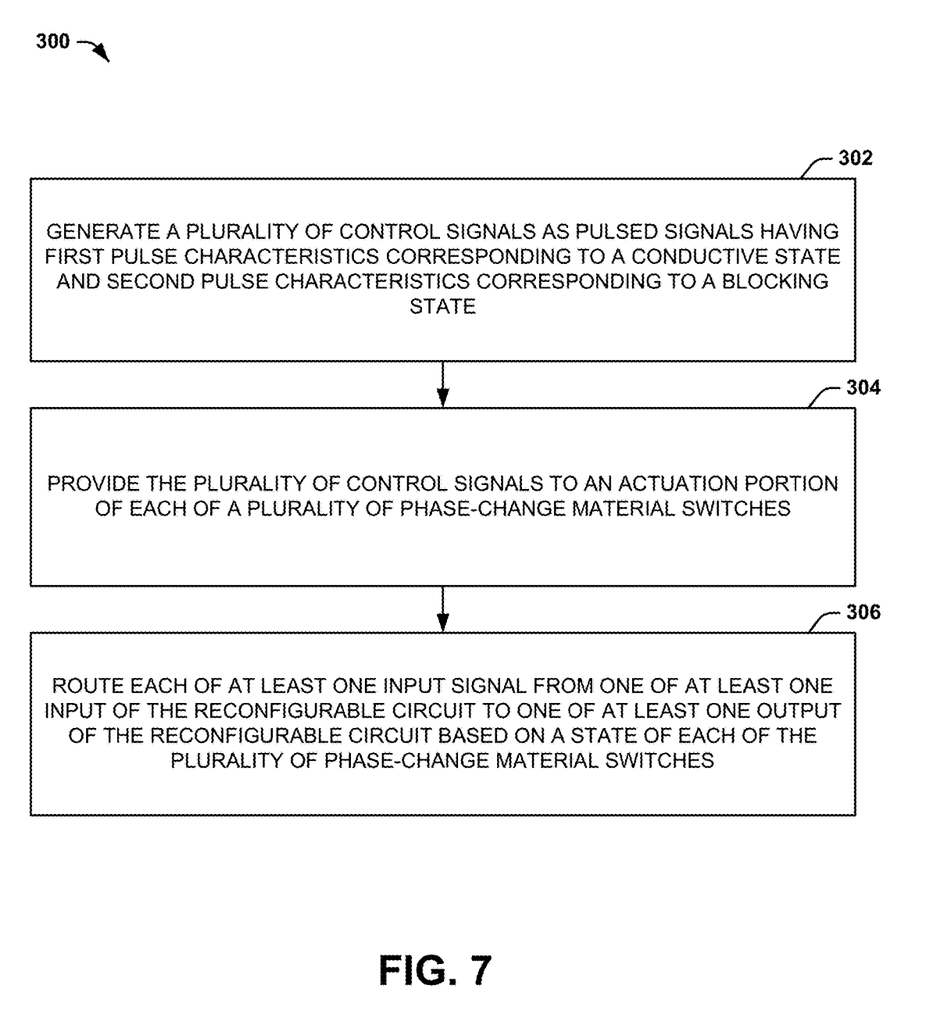
FIG. 7 illustrates an example of a method for controlling a reconfigurable circuit.

In view of the foregoing structural and functional features described above, a methodology in accordance with various aspects of the present invention will be better appreciated with reference to FIG. 7. While, for purposes of simplicity of explanation, the methodology of FIG. 7 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 7 illustrates an example of a method 300 for controlling a reconfigurable circuit. At 302, a plurality of control signals (e.g., the control signals $CTRL_1$ through $CTRL_Z$) are generated as pulsed signals having first pulse characteristics corresponding to a conductive state (e.g., demonstrated in the first state diagram 52) and second pulse characteristics corresponding to a blocking state (e.g., demonstrated in the second state diagram 54). At 304, the plurality of control signals are provided to an actuation portion (e.g., the actuation portion 20) of each of a plurality of phase-change material switches (e.g., the phase-change material switch 12). The actuation portion can be proximal to a respective switch portion (e.g., the switch portion 18) of each of the plurality of phase-change material switches and can be configured to generate a first heat profile (e.g., demonstrated in the first state diagram 52) in response to the first pulse characteristics to set the switch portion to the conductive state and a second heat profile (e.g., demonstrated in the first state diagram 54) in response to the second pulse characteristics to set the switch portion to the blocking state. At 306, each of at least one input signal is routed from one of at least one input (e.g., the input 154) of the reconfigurable circuit to one of at least one output (e.g., the first and second outputs 156 and 158) of the reconfigurable circuit based on a state of each of the plurality of phase-change material switches.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A reconfigurable circuit comprising a phase-change material switch, the phase-change material switch comprising:

an actuation portion configured to receive a control signal having one of a first state and a second state and to emit a first heat profile in response to the first state of the control signal and a second heat profile in response to the second state of the control signal, the control signal being provided as a pulsed signal having first pulse characteristics in the first state and second pulse characteristics in the second state, the first pulse characteristics corresponding to a signal pulse that is at least one of lower power and longer in duration relative to the second pulse characteristics; and a switch portion comprising a phase-change material in proximity with the actuation portion, the switch portion being selectable between a conducting state in response to the first heat profile to conduct a radio-frequency input signal from an input to an output of the phase-change material switch and a blocking state in response to the second heat profile to substantially block the radio-frequency input signal from the input to the output, the input, the phase-change material, and the output having an inline configuration.

2. The circuit of claim 1, wherein the conducting state corresponds to the phase-change material being set to a crystalline physical state in response to the first heat profile, and wherein the blocking state corresponds to the phase-change material being set to an amorphous physical state in response to the second heat profile.

3. The circuit of claim 2, wherein the first pulse characteristics in the first state switch the phase-change material to the crystalline physical state and the second pulse characteristics in the second state switch the phase-change material to the amorphous physical state.

4. The circuit of claim 2, wherein the phase-change material is configured to maintain a respective one of the crystalline physical state and the amorphous physical state subsequent to application of the control signal.

5. The circuit of claim 1, wherein the first heat profile corresponds to crystallization of the phase-change material in response to the control signal having the first pulse characteristics to maintain the switch portion in the conducting state, and wherein the second heat profile corresponds to melting of the phase-change material in response to the control signal having the second pulse characteristics to maintain the switch portion in the blocking state.

6. The circuit of claim 1, wherein the inline configuration of the input, the phase-change material, and the output is such that the phase-change material is substantially inline with a transmission line corresponding to the input and the output of the phase-change material switch and configured to conduct the radio-frequency input signal.

7. The circuit of claim 1, further comprising a plurality of phase-change material switches to route each of at least one radio-frequency input signal from one of at least one input of the reconfigurable circuit to one of at least one output of the reconfigurable circuit.

8. The circuit of claim 7, further comprising a switch controller configured to generate a respective plurality of control signals that are each provided to a respective one of the plurality of phase-change material switches in one of the first state and the second state to switch the respective one of the plurality of phase-change material switches between the conducting state and the blocking state.

9. The circuit of claim 7, further comprising a plurality of signal paths based on a state of each of the plurality of phase-change material switches to conduct each of the at least one radio-frequency input signal in three-dimensions along one of the plurality of signal paths.

10. A reconfigurable circuit comprising:

a switch configuration comprising a plurality of phase-change material switches that each comprise an input, an output, and a phase-change material configured to switch between a conducting state corresponding to a substantially short circuit and a blocking state corresponding to a substantially open circuit in response to one of a respective plurality of control signals, the input, the phase-change material, and the output of each of the plurality of phase-change material switches having an inline configuration, each of the plurality of control signals being provided as a pulsed signal having first pulse characteristics and second pulse characteristics, the first pulse characteristics corresponding to a signal pulse that is at least one of lower power and longer in duration relative to the second pulse characteristics, the plurality of phase-change switches being configured to route each of at least one radio-frequency input signal from one of at least one input of the reconfigurable circuit to one of at least one output of the reconfigurable circuit; and a switch controller configured to generate the plurality of control signals that are each provided in one of the first pulse characteristics and the second pulse characteristics to switch the respective one of the plurality of phase-change material switches between the conducting state and the blocking state.

11. The circuit of claim 10, wherein each of the plurality of phase-change material switches further comprises an actuation portion in proximity with the phase-change material and which is configured to receive the one of the respective plurality of control signals, and to emit a first heat profile in response to the first state of the one of the plurality of control signals to set the phase-change material to the conducting state and a second heat profile in response to the second state of the one of the respective plurality of control signals to set the phase-change material to the blocking state.

12. The circuit of claim 11, wherein the first heat profile corresponds to crystallization of the phase-change material of the respective one of the plurality of phase-change material switches in response to the one of the respective plurality of control signals having the first pulse characteristics to maintain the phase-change material of the respective one of the plurality of phase-change material switches in the conducting state, and wherein the second heat profile corresponds to melting of the phase-change material of the respective one of the plurality of phase-change material switches in response to the one of the respective plurality of control signals having the second pulse characteristics to maintain the phase-change material of the respective one of the plurality of phase-change material switches in the blocking state.

13. The circuit of claim 10, wherein the first pulse characteristics in the first state switch the phase-change material of the respective one of the plurality of phase-change material switches to a crystalline physical state and the second pulse characteristics in the second state to switch the phase-change material of the respective one of the plurality of phase-change material switches to an amorphous physical state.

14. The circuit of claim 10, further comprising a plurality of transmission lines, wherein the plurality of transmission lines form a plurality of signal paths for the at least one input signal based on a state of each of the plurality of phase-change material switches to conduct each of the at least one input signal in three-dimensions along one of the plurality of signal paths.

15. A method for controlling a reconfigurable circuit, the method comprising:

generating a plurality of control signals as pulsed signals having first pulse characteristics corresponding to a conductive state and second pulse characteristics corresponding to a blocking state, the first pulse characteristics corresponding to a signal pulse that is at least one of lower power and longer in duration relative to the second pulse characteristics;

providing the plurality of control signals to an actuation portion of each of a plurality of phase-change material switches, the actuation portion being proximal to a respective switch portion of each of the plurality of phase-change material switches and being configured to generate a first heat profile in response to the first pulse characteristics to set the switch portion to the conductive state and a second heat profile in response to the second pulse characteristics to set the switch portion to the blocking state; and routing each of at least one radio-frequency input signal from one of at least one input of the reconfigurable circuit to one of at least one output of the reconfigurable circuit based on a state of each of the plurality of phase-change material switches.

16. The method of claim 15, wherein providing the plurality of control signals comprises providing each of the plurality of control signals to the actuation portion of each of the plurality of phase-change material switches to crystallize a phase-change material of the switch portion associated with a respective one of the plurality of phase-change material switches in response to the first heat profile and to melt the phase-change material of the switch portion associated with the respective one of the plurality of phase-change material switches in response to the second heat profile.

17. The method of claim 15, wherein each of the plurality of phase-change material switches comprise an input, an output, and a phase change material, wherein the input, the output, and the phase change material have an inline configuration.

* * * * *